United States Patent [19]
Higgins, III

[11] Patent Number: 5,173,764
[45] Date of Patent: Dec. 22, 1992

[54] SEMICONDUCTOR DEVICE HAVING A PARTICULAR LID MEANS AND ENCAPSULANT TO REDUCE DIE STRESS

[75] Inventor: Leo M. Higgins, III, Austin, Tex.

[73] Assignee: Motorola, Inc., Schaumburg, Ill.

[21] Appl. No.: 681,608

[22] Filed: Apr. 8, 1991

[51] Int. Cl.[5] .................. H01L 23/30; H01L 23/04
[52] U.S. Cl. ................................... 257/669; 257/687
[58] Field of Search .................... 357/72, 74, 80, 75

[56] References Cited

U.S. PATENT DOCUMENTS 4,712,129  12/1987  Orcutt .................................. 357/72

FOREIGN PATENT DOCUMENTS

| 0248541 | 11/1986 | Japan | 357/72 |
| 0302542 | 12/1988 | Japan | 357/72 |
| 0302543 | 12/1988 | Japan | 357/72 |
| 0169954 | 7/1989 | Japan | 357/72 |

Primary Examiner—Andrew J. James
Assistant Examiner—S. V. Clark
Attorney, Agent, or Firm—Patricia S. Goddard

[57] ABSTRACT

A semiconductor device (20) has reduced die stress by incorporating a lid (30) which constrains the expansion and contraction of an encapsulant. In one embodiment, a semiconductor die (22) having an active surface (23) is coupled to a plurality of leads (24). An encapsulant (28) is disposed on the active surface. The lid (30) overlies the active surface (23) and is adhesively coupled to the semiconductor die (22) by the encapsulant (28). The lid is of a material which has a coefficient of thermal expansion which closely approximates that of the semiconductor die in order to prevent stress build-up in the die which is normally caused by higher rates of expansion and contraction of the encapsulant in comparison to the those of the semiconductor die.

16 Claims, 4 Drawing Sheets

SEMICONDUCTOR DEVICE HAVING A PARTICULAR LID MEANS AND ENCAPSULANT TO REDUCE DIE STRESS

TECHNICAL FIELD OF THE INVENTION

The present invention relates to semiconductor devices in general, and more specifically to semiconductor devices having reduced stresses acting upon a semiconductor die and processes for making the same.

BACKGROUND OF THE INVENTION

Manufacturers are driven to make semiconductor devices as small as possible, both in terms of area (length and width) and height. While the area of a device is most limited by the size of a semiconductor die included in the device, the height of the device is usually limited by a package body which encapsulates the die. Conventional plastic and ceramic packages account for a majority of the overall size of a semiconductor device. Several packaging technologies have emerged to help reduce the size of a package, one such technology being TAB (tape automated bonding). TAB devices employ a flexible polymer support member which is similar to film used in 35 millimeter cameras. Thin copper foil is laminated to, or formed upon, the polymer film. The film is patterned by etching away selected portions of the copper to form a plurality of copper leads. The leads are often coated with a conductive film, for instance tin or gold. The conductive leads are electrically coupled to an active surface of a semiconductor die usually by thermal compression or liquid phase bonding. An encapsulant is deposited onto the surface of the die to provide mechanical protection and to prevent environmental contamination, while at the same time helping to secure each of the leads in place. In many TAB devices, the encapsulant acts as a protective member much like conventional plastic and ceramic package bodies. However, the encapsulant is typically very thin, often less than 250 $\mu$m or one-quarter of a millimeter, thus achieving a very thin package profile.

Although TAB devices have provided a significant advantage by reducing the size of semiconductor devices, TAB has also brought about several disadvantages which respect to manufacturability. A considerable problem is that the encapsulant overlying the die surface creates stress in the die because the coefficient of thermal expansion (CTE) is typically much higher for the encapsulant than for the semiconductor die. For example, the CTE of silicon which is commonly used as a die material is on the order of 2.7–3 ppm (parts per million)/° C. while the CTEs of commonly used encapsulants are on the order of 15–200 ppm/° C. Stresses in the die are primarily the result of curing the encapsulant. After being deposited, the encapsulant is cured to remove unwanted solvents and to cross-link or rigidify the material. Upon being brought to room temperature following the cure, the encapsulant contracts much more than the semiconductor die due to the differing CTEs. Thus, the encapsulant creates compressive stresses in the die which, if severe enough, can cause the die to warp or crack. The stress problem becomes worse as the size of the die or thickness of the encapsulant increases. The composition of encapsulants (for instance filler materials, filler volume percent, and polymer type) has been varied to help minimize the CTE mismatch between the encapsulant and the die. However, materials with CTEs closer to the CTE of silicon, in other words with lower CTEs, often have poorer thermal performance. Thermal performance refers to the ability to conduct heat and is an important property in encapsulant materials used in high power devices. In addition, low CTE encapsulants may have higher dielectric constants resulting in an undesirable increase in die capacitance.

Flow control of the encapsulant material is another problem in the manufacturing of TAB devices. Typically, the encapsulant is dispensed onto an active surface of a semiconductor die in a pattern of closely spaced dots or lines or in a puddle in the center of the active surface. It is desirable for the encapsulant to flow evenly across the entire active surface and establish a substantially continuous film. Not only is this film used to protect the die from mechanical damage, but also from environmental contamination such as water ingression. Therefore, it is critical that the encapsulant cover as much of the active surface as possible. To assure that the active surface will be covered sufficiently, some semiconductor manufacturers over-compensate by partially flowing the encapsulant over edges of the die. However, in doing so, it is difficult to control the amount of "overflow" in such a way as to prevent the encapsulant from flowing onto the backside of the die. Additional flow control problems arise upon curing an encapsulated device. Heat associated with the cure process initially softens the encapsulant (before cross-linking progresses to a rigid state), allowing the material to flow more freely. However, it is difficult to predict how a deposited encapsulant will flow upon exposure to elevated temperatures such as those used in curing.

Flow properties of common encapsulant materials also make it difficult to achieve a uniform thickness of material across a die surface. For example, the thickness of the encapsulant near edges of the die is often much less than the thickness in the center of the die. The portions of the die near the edge will therefore have less protection. Uneven encapsulant thickness also creates problems relating to appearance and the ability to mark or print on the device. Semiconductor devices are generally marked, for instance by pad printing, with the manufacturer's name and an identification number. Uneven surfaces degrade the quality of the marking.

Therefore a need exists for an improved semiconductor device, and more specifically for an improved semiconductor device which has reduced stress on a semiconductor die and which provides better flow control of an encapsulant material and a process for making the same.

BRIEF SUMMARY OF THE INVENTION

The previously described disadvantages of existing semiconductor devices are overcome and other advantages are achieved with the present invention. In one form, a semiconductor device is comprised of a semiconductor die having an active surface to which a plurality of leads is electrically coupled. A lid overlies the active surface, being separated from the active surface by a space. The lid is of a material which has a coefficient of thermal expansion which closely approximates that of the semiconductor die. An encapsulant material fills at least a portion of the space between the lid and the semiconductor die and is adhesively coupled to both the lid and the active surface of the semiconductor die such that the lid constrains the thermal expansion and contraction of the encapsulant to reduce stress in the semiconductor die.

DETAILED DESCRIPTION OF A PREFERRED EMBODIMENT

Figure 1:
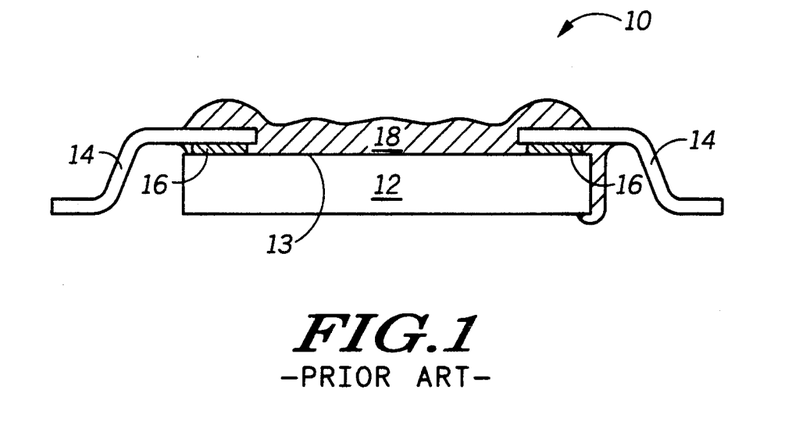
FIGS. 1 and 2 illustrate, in cross-section, a known semiconductor device and problems associated with flow control of an encapsulant material.
Figure 2:
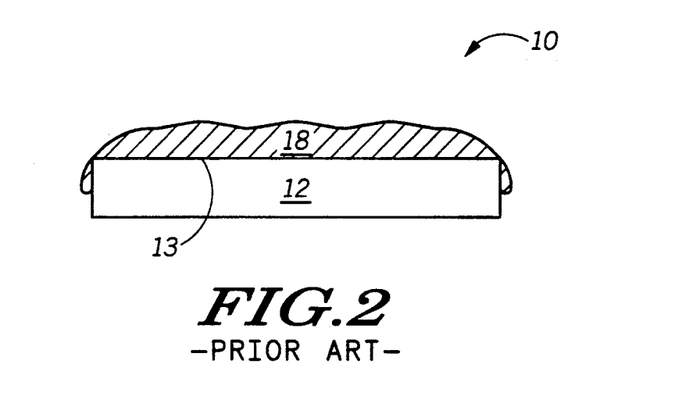

Illustrated in FIGS. 1 and 2 are known semiconductor devices such as those described previously in the background. In FIG. 1, a semiconductor device 10 includes a semiconductor die 12 which is typically a microprocessor, memory, or other integrated circuit. Semiconductor die 12 has an active surface 13 to which a plurality of leads, such as leads 14, are electrically coupled. As described earlier, leads 14 are part of a thin, flexible circuit tape which has been patterned to form conductive paths. The device of FIG. 1 has been excised from the flexible tape and formed in a conventional manner, thus the entire tape is not illustrated. The leads are coupled to the die using known bonding techniques, such as thermal compression bonding of the leads to a predetermined pattern of bumps, such as bumps 16. Bumps 16 are formed on bonding pads (not shown) of the active surface 13 of semiconductor die 12 in a conventional manner and are of a conductive material such as gold, nickel, copper, solder, or the like.

An encapsulant 18 overlies semiconductor die 12 to protect active surface 13 from mechanical damage and contamination. Encapsulating materials are usually filled polymers, for example an epoxy filled with fused $SiO_2$ and perhaps carbon. Filled polymer materials provide good mechanical protection; however, such materials exert high stresses on semiconductor die which can lead to cracking and poor reliability. Silicone elastomers, a type of polymer, are also used as encapsulating materials in order to reduce the amount of stress exerted on the die, but elastomers may provide inadequate mechanical protection and are difficult to print on or mark.

Additional problems with encapsulants in existing semiconductor devices are illustrated in FIGS. 1 and 2. Encapsulant 18 of FIG. 1 has a very uneven upper surface which impedes marking techniques such as pad printing. The thickness of encapsulant 18 is also greater in regions above leads 14 than in regions where leads are not present. The thickness differential is due to the encapsulant's wetting properties. Upon wetting the leads and bumps, the encapsulant is constrained from flowing as freely as encapsulant located elsewhere due to surface energy and surface tension effects. Uneven flow of the encapsulant not only creates markability problems, but also affects the appearance of the device and the ability to maintain a controlled encapsulant thickness.

In the right portion of FIG. 1, another problem relating to flow control of encapsulant 18 is illustrated. Encapsulant 18 has flowed down a side and along the bottom surface of semiconductor die 12. While some manufacturers desire the encapsulant to partially flow along the side of a die to provide better protection against contamination, it is difficult to precisely control the amount of flow along the side. The encapsulant may continue to flow along the bottom surface of the die, as illustrated, thereby creating an uneven bottom surface which is to be subsequently mounted to a substrate. Mounting the device to a substrate is made more difficult if the mounting surface is uneven. Furthermore, encapsulating material on the bottom surface of the die will be in contact and contaminate tooling used throughout remaining assembly operations.

FIG. 2 illustrates a different cross-sectional view of the known device of FIG. 1, in particular a cross-section of a portion of device 10 without leads. Encapsulant 18 of FIG. 2 illustrates some of the problems mentioned previously, but also illustrates another problem, that of edge protection of semiconductor die 12. Notice that encapsulant 18 on active surface 13 is much thinner at the edges of the die than in the center. The encapsulant tends to pull away from the sharp die edge. Thinning near the edges of the die occurs even after encapsulant flows over the die's edge and along the side, as illustrated. But having the encapsulant thinner near the edges of die 12 reduces the encapsulant's effectiveness in protecting the active surface and preventing contamination. It is more desirable to have a uniform encapsulant thickness across the entire active surface.

The present invention addresses each of the problems and in addition provides several other advantages. Embodiments of the present invention use lids which improve die stress, mechanical protection of the die, markability, and encapsulant flow and thickness control. The present invention can also improve thermal performance of a semiconductor device as well as provide EMI (electromagnetic interference) shielding. Various embodiments of the present invention are illustrated in FIGS. 3–8 and are described below.

Figure 3:
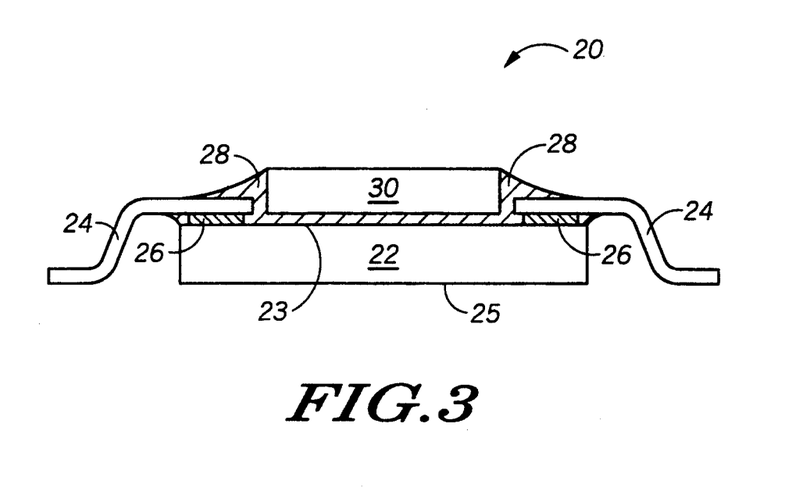
FIG. 3 illustrates, in cross-section, a semiconductor device in accordance with the present invention.

FIG. 3 illustrates, in cross-section, a semiconductor device 20, in accordance with the present invention. Semiconductor device 20 includes a semiconductor die 22 having an active surface 23 and an exposed bottom surface 25. The die may be an integrated circuit such as a microprocessor, memory, gate array, or the like, and is made from conventional semiconductor materials. Most often, the bulk of semiconductor die 22 is silicon, but may be of another semiconducting material such as gallium arsenide. A plurality of leads 24 is coupled to the semiconductor die via bumps 26. FIG. 3 illustrates a TAB device in which leads 24 have been coupled to die 22 by thermally compressing the leads to the bumps. As discussed earlier, bumps are formed on the active surface of the die in a known manner. It should be understood, however, that the present invention is not limited to use in TAB devices. For example, the present invention may also be implemented on thin-profile, wire-bonded devices.

Also included in semiconductor device 20 is an encapsulant 28. As in conventional devices, encapsulant 28 is used to protect active surface 23 of semiconductor die 22 from mechanical damage and contamination.

Suitable encapsulants for use in the present invention include known polymer materials. The thickness of encapsulant 28 can vary depending on the requirements for device 20, but is usually on the order of one millimeter or less. If the thickness of encapsulant 28 is too large, the thermal expansion constraint imposed by a lid 30 is less effective. In accordance with the present invention, lid 30 is adhesively coupled to die 22 by encapsulant 28 and provides several advantages. In addition to added mechanical protection, a significant advantage is that lid 30 reduces the amount of stress that encapsulant 28 exerts on die 22. As mentioned earlier, differing expansion rates between the encapsulant and the die create high stresses in the die. Lid 30 and die 22 form a composite structure which restricts the expansion and contraction of encapsulant 28 such that the encapsulant will expand or contract only as much as the composite structure. By choosing the material of lid 30 to have a coefficient of thermal expansion (CTE) similar to the CTE of the bulk material of semiconductor die 22, stress on the die is minimized. For the case that the bulk material of the semiconductor die is silicon, which has a CTE of approximately 3 ppm (parts per million)/°C., utilizing a lid which is also made of silicon will minimize stress. Furthermore, silicon is inexpensive and provides good thermal dissipation. Another advantage in using a silicon lid is that encapsulant materials have good adhesion to silicon. Other lid materials suitable for use in the present invention include molybdenum (CTE$\approx$5 ppm/°C.), tungsten (CTE$\approx$4.5 ppm/°C.), Invar (CTE$\approx$2.7 ppm/°C.), aluminum nitride (CTE$\approx$4.5 ppm/°C.), molybdenum-copper composites, tungsten-copper composites, graphite fiber reinforced copper, or other material which has a CTE which is similar to that of the semiconductor die over the temperature range of interest (about $-50°$ C. to 150° C.). Furthermore the lid may be of a non-metallic material including glass, ceramic, or composites such as aramid reinforced epoxy, graphite fiber reinforced epoxy, fused silica fiber reinforced epoxy, provided the CTE of the lid material closely matches that of the semiconductor die.

Figure 4:
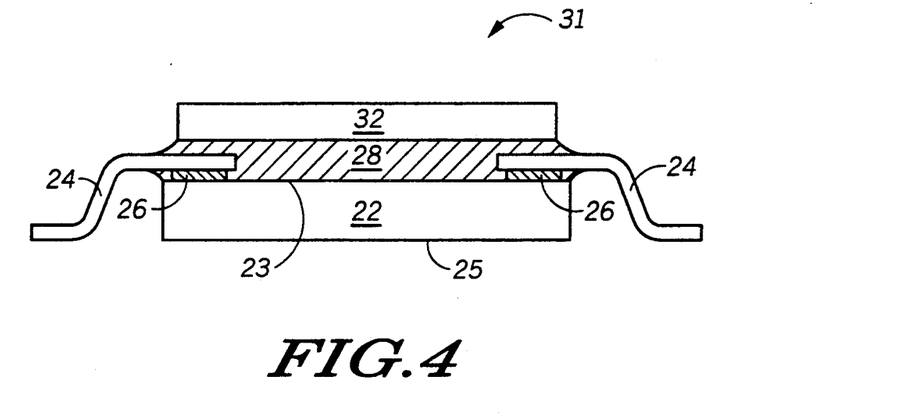
FIGS. 4 and 5 illustrate, in two distinct cross-sections, a semiconductor device also in accordance with the present invention.

The height of device 20 illustrated in FIG. 3 is kept to a minimum because lid 30 can be positioned very close to active surface 23. In addition to reducing the height, having lid 30 in close proximity to active surface 23 aids in dissipating heat from the active surface and reduces the amount of encapsulant material 28 required. For applications which have fewer constraints on the device thickness, the lid may be larger in order to secure the leads in place, as illustrated in FIG. 4. Device 31 is illustrated in cross-section in FIG. 4 with a lid 32 which is slightly larger than lid 30 of FIG. 3. (For convenience, similar elements are labeled the same in some of the figures and throughout the description.) By having lid 32 larger, the lid overlies the plurality of leads 24, thereby securing the leads in the device better than in conventional devices. As demonstrated by the different sized lids in the embodiments illustrated in FIGS. 3 and 4, it should be understood that the size of the lid, including lid thickness, can vary in accordance with the present invention, provided the lid properly constrains the expansion and contraction of the encapsulant, thereby reducing stress in the die.

Figure 5:
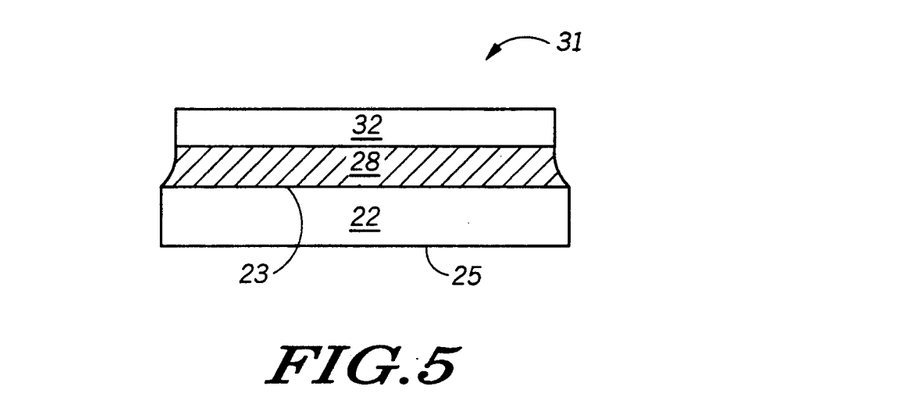

Illustrated in FIG. 5 is a different cross-sectional view of the device illustrated in FIG. 4. The cross-sectional view of FIG. 5 is taken along a portion of semiconductor device 31 which does not have leads. Unlike the known semiconductor device 10 of FIG. 2, device 31 of FIG. 5 has a very uniform encapsulant thickness. Because encapsulant 28 is "sandwiched" by semiconductor die 22 and lid 32, the surface tension forces of the encapsulant will make edge overflow less likely. The uniform encapsulant thickness of device 20 establishes nearly uniform protection across active surface 23 of the semiconductor die.

Figure 6:
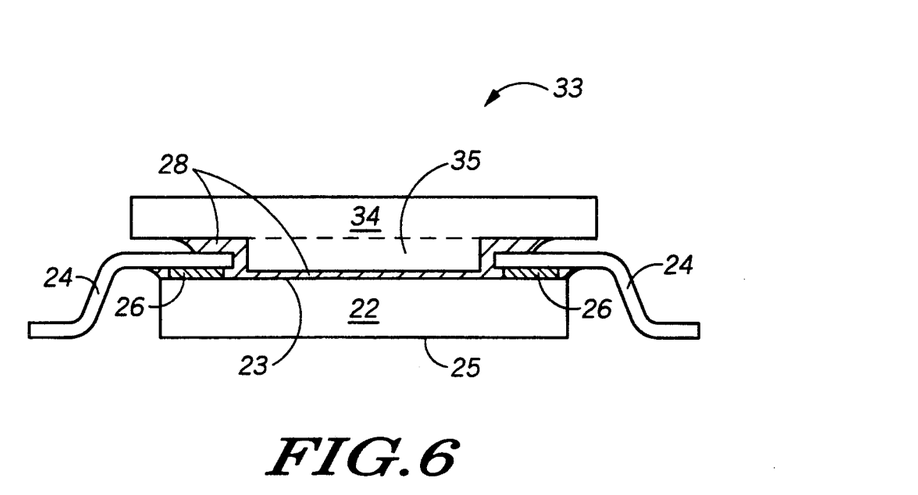
FIG. 6 illustrates, in cross-section, another embodiment of the present invention which has been adapted for improved thermal dissipation.

FIG. 6 illustrates, in cross-section, a semiconductor device 33 which has enhanced thermal dissipation. A lid 34 that is shaped in such as way as to increase exposed surface area of the lid is included in device 33 and is in close proximity to active surface 23 of semiconductor die 22. By adding a feature, such as protrusion 35, to lid 34, the lid is able to be brought in close proximity to the active surface of the die, thereby improving heat dissipation. Lid 34 is also wider than lids previously illustrated, giving lid 34 more exposed surface area. As is well known in the art, maximizing the surface are of a structure increases the structure's ability to dissipate heat. Similarly, the surface area of lid 34 could be increased in other ways to improve thermal performance, for instance by forming channels or grooves in the lid. To further improve thermal performance of devices in accordance with the present invention, an encapsulant material can be chosen that has been optimized for high thermal conductivity. Most known filler materials which impart high thermal conductivity to encapsulants do not reduce encapsulant thermal expansion to desirable levels. The lid used in semiconductor devices in accordance with the present invention minimizes the stress imposed by thermal conductive encapsulants having a CTE or modulus of elasticity higher than desired. Therefore, encapsulant materials which are often avoided because the materials exert too much stress on a die can be used in the present invention since the lid constrains expansion and contraction of the encapsulating material. Encapsulant materials with a high degree of thermal conductivity include polymers filled with diamond, silicon, silicon carbide, aluminum nitride, graphite, beryllium oxide, boron nitride, or the like. Increasing the volume of high thermal conductivity filler material in a polymer also increases the modulus of elasticity, or in other words increases the stiffness. This higher modulus is undesirable for conventional, unconstrained encapsulants, but use of a lid permits use of such high thermal conductivity encapsultants.

Figure 7:
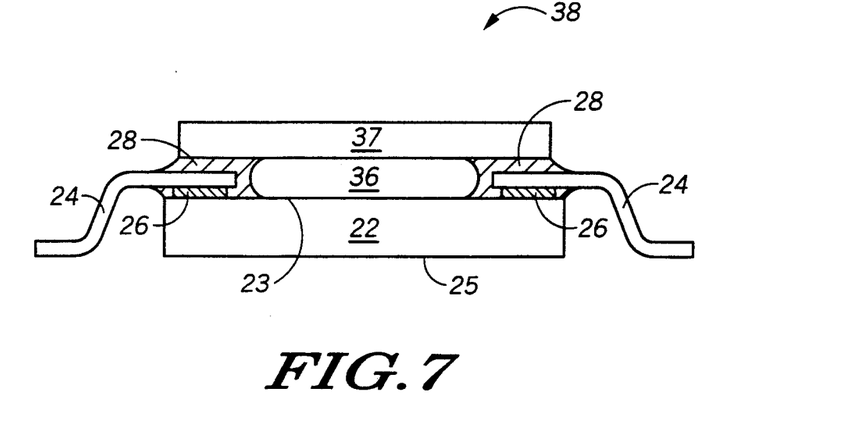
FIG. 7 illustrates, in cross-section, a semiconductor device in accordance with the present invention which reduces parasitic capacitance of a semiconductor die.

Illustrated in cross-section in FIG. 7 is a semiconductor device 38 also in accordance with the present invention. Unlike previously described embodiments, encapsulant material 28 does not completely cover active surface 23 of semiconductor die 22. Instead, encapsulant 28 provides peripheral encapsulation while forming a cavity 36 located between semiconductor die 22 and a lid 37. Device 38 of FIG. 7 is formed by depositing encapsulant 28 on the periphery of active surface 23, as opposed to depositing the encapsulant across the entire surface. The thickness and width of the seal formed by encapsulant 28 should be sufficient to secure leads 24 in place while also preventing moisture or other contaminants from reaching active surface 23. To further prevent contamination, conventional passivation layers or die coats may be formed on the active surface. An advantage of the device illustrated in FIG. 7 is that usual parasitic capacitance effects on semiconductor die 22 due to full die junction surface coating by an encapsulant are reduced due to the presence of an air-filled cavity 36. Conventional encapsulation of the entire active surface of the die results in parasitic capacitance loading of all conductor lines formed on the active surface due to the presence of an overlying dielectric, namely the encapsulant. Encapsulants typically have dielectric constants on the order of 2.5 to 4.5. The embodiment of the present invention illustrated in FIG. 7 has reduced parasitic capacitance because a majority of the encapsulant which would normally overlie active surface 23 has been replace by air which has a dielectric constant of 1. In forming cavity 36, lid 37 may be attached to the device in a controlled atmosphere, such as nitrogen or vacuum, instead of in an air ambient. However in time, ambient air may diffuse across the encapsulant's bond interface if the interface is too narrow, thereby diluting the initially controlled atmosphere in cavity 36.

FIGS. 8A-8E are cross-sectional views depicting a process for making a semiconductor device 50 in accordance with the present invention. In particular, this series of figures illustrates fabrication of a semiconductor device which provides EMI (electromagnetic interference) shielding. It should be understood that one of ordinary skill in the art could modify the process illustrated in FIGS. 8A-8E to fabricate other embodiments of the present invention.

As illustrated in FIG. 8A, a semiconductor die 40 is provided and has a plurality of bumps 42 formed on an active surface 43 of the semiconductor die. A plurality of leads, such as leads 44, are bonded and electrically coupled to bumps 42 using known bonding techniques such as thermal compression, thermosonic, or ultrasonic bonding or by soldering or welding. Leads 44 are part of a leadframe (not shown), for instance a thin, flexible tape or film like that used in TAB devices. A predetermined amount of encapsulant 46 is deposited onto active surface 43. The amount of encapsulant deposited is dependent upon the desired final thickness of the material as well as the flow and curing characteristics of the material. Although encapsulant 46 is illustrated as being deposited as one large, rounded mass, depositions in the form of dot patterns, line patterns, or other deposition techniques are also suitable. The encapsulant material is chosen to meet specific needs of a semiconductor device. For example, a high power device may need an encapsulant with high thermal conductivity, while radiation sensitive devices may require an encapsulant with very low alpha particle emission.

A lid 48 is positioned over the active surface of semiconductor die 40, and lid 48 and die 40 are coupled by encapsulant 46. As lid 48 is positioned, encapsulant 46 is distributed across active surface 43 and along a surface of the lid, resulting in the semiconductor device 50 illustrated in FIG. 8B. The lid material has a coefficient of thermal expansion which closely approximates that of the bulk material of semiconductor die 40 in order to reduce stress build-up in the die. The size of lid 48 is of any size capable of constraining expansion and contraction of encapsulant 46. Lid 48 is illustrated as being larger than semiconductor die 40, although the lid may instead be smaller. In having lid 48 larger than the die, it is not only possible to dissipate more heat, but lid 48 may be used as a more effective EMI shield since a portion of leads 44 can be shielded. As an example, lid 48 can be used as an EMI shield by grounding the lid. One possible method of grounding lid 48 is to electrically couple the lid to designated ground leads, such as leads 44, or to directly to selected bumps of the semiconductor device. Lid 48 may instead be coupled to leads of a fixed potential other than ground, thereby functioning as a non-ground reference plane to on-chip interconnect lines. Fabrication of a device in accordance with the present invention having EMI shielding is illustrated in the remaining figures.

As illustrated in FIG. 8B, an electrically conductive adhesive 49 is formed on lid 48 in a pattern corresponding to particular leads to which lid 49 will be coupled. Alternatively, the adhesive could be formed on selected bumps which are to be coupled to lid 48. Electrically conductive adhesive 49 may be gold, tin, solder, a conductive polymer, or the like. The electrically conductive adhesive 49 may also be an anisotropic or unidirectionally conductive polymeric adhesive which conducts only in the direction normal to the joined surfaces. Electrically conductive adhesive 49 may be applied to lid 48 using known methods, for example by screen printing. Rather than applying an adhesive coupling material to the lid, the lid may also be bonded directly to selected leads. After positioning lid 48, encapsulant 46 is cured. Alternatively, encapsulant 46 may be partially cured prior to positioning the lid and subsequently fully cured once the lid is in place.

Figure 8:
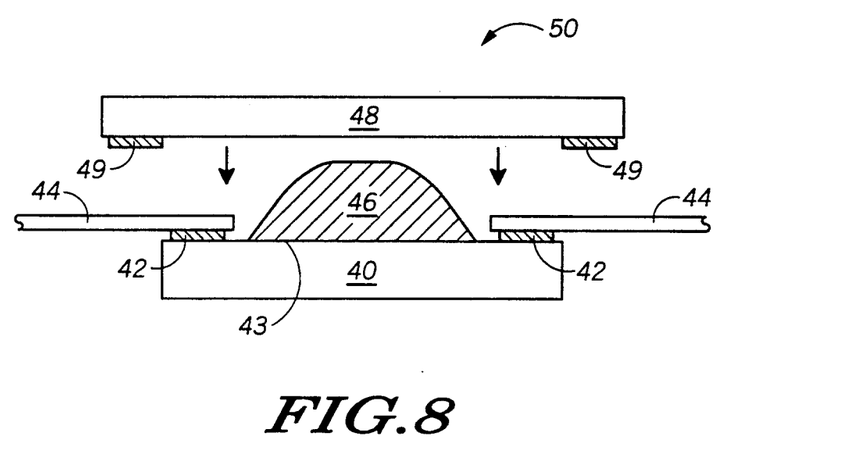
FIGS. 8A–8E illustrate, in cross-section, a method of making a semiconductor device with EMI (electromagnetic interference) shielding, in accordance with the present invention.
Figure 8C:
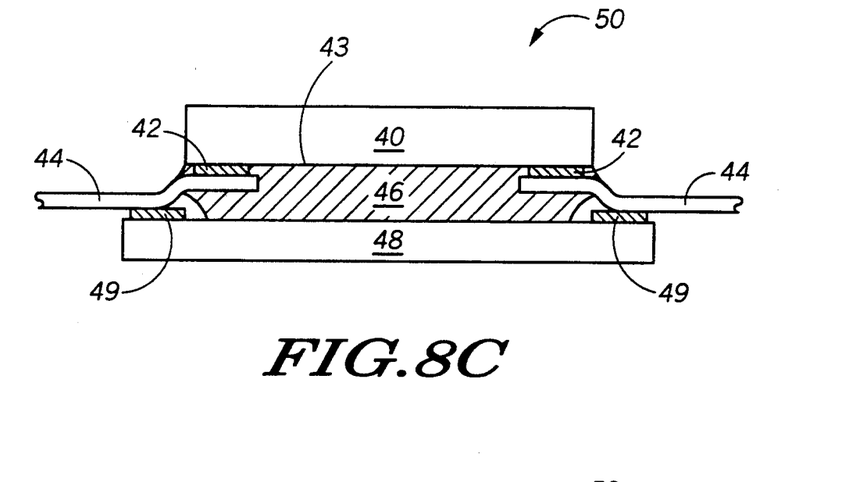

As illustrated in FIG. 8C, device 50 is flipped so that lid 48 is at the bottom of the device to facilitate bonding leads 44 to the electrically conductive adhesive 49. The bonding is accomplished using known bonding techniques such as single point thermal compression or thermosonic bonding. In bonding leads 44 to lid 48, the lead shape is altered very slightly. While changing the shape of the leads has no affect on device performance, it is important that the integrity of encapsulant 46 and of the bonds between leads 44 and the semiconductor die is maintained in bonding the leads to the lid. The leads 44 of device 50 of FIG. 8C are electrically coupled to both the semiconductor die 40 and to lid 48, allowing the lid to function as a grounded, or other fixed potential, reference plane.

Figure 8D:
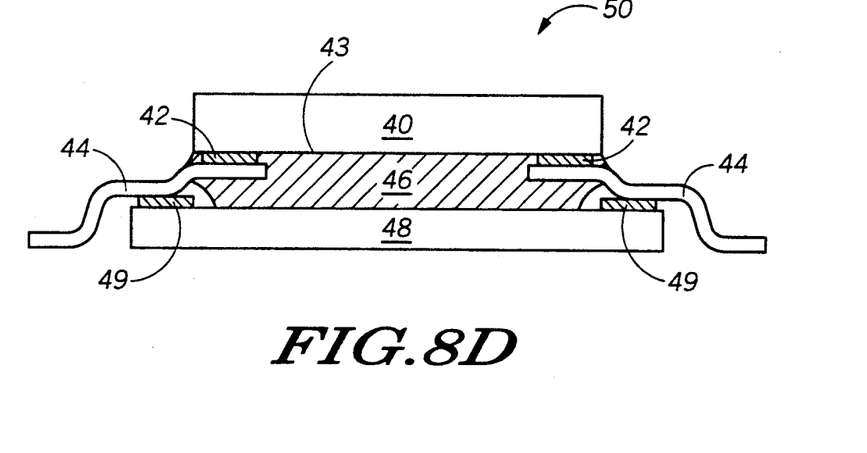
Figure 8E:
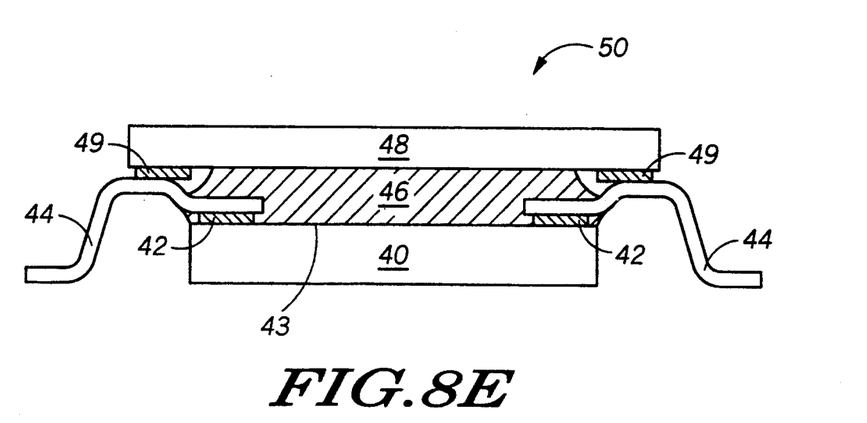
Figure 9:
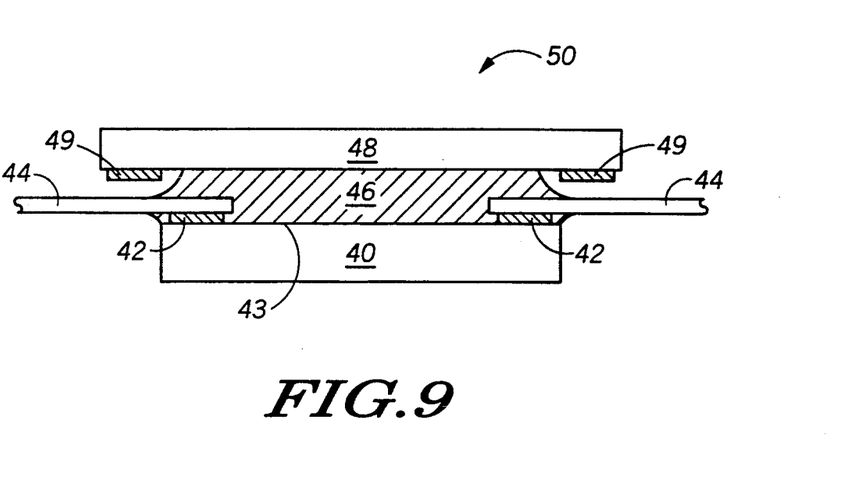

Device 50 is excised from a leadframe (not shown) by severing leads 44. The leads are then formed into a desired lead configuration, such as the two types of gull-wing configurations illustrated in FIGS. 8D and 8E. Device 50 of FIG. 8D is considered a "flip-TAB" device since semiconductor die 40 is in a die-down position, or in other words the active surface 43 of the die is facing downward. Alternatively, device 50 may be configured into a conventional TAB configuration by having the active surface of the die facing upward, as illustrated in FIG. 8E. The choice of using a flip-TAB or conventional configuration may be determined by the method in which heat is to be removed from the device and the preferred EMI shielding configuration. For instance, the device illustrated in FIG. 8E may be preferred for use on substrates (e.g. PC boards) which are adapted to draw heat from a semiconductor device. On the other hand, if the substrate cannot be designed to optimize heat transfer, a device such as that illustrated in FIG. 8D may be preferred. The encapsulant 46 and the lid 48 can be optimized for heat transfer, but the lowest thermal resistance path will usually be through die 40.

The present invention has several advantages over conventional semiconductor devices. By employing a lid which has a coefficient of thermal expansion which closely approximates that of a semiconductor die, stresses typically induced by encapsulant materials are reduced. Furthermore, the presence of the lid provides additional mechanical protection, establishes a very uniform encapsulant thickness, permits use of a very thin encapsulant, and creates a smooth surface on which to mark. The lid may be modified to improve thermal dissipation, for example by choosing a highly thermally conductive material for the lid or by increasing the surface area of the lid. The lid may also be used as a fixed potential reference plane to reduce EMI by coupling the lid to selected leads of a semiconductor device. Another embodiment of the present invention uses the lid to create an air-gap over the active surface of a semiconductor die in order to reduce parasitic die capacitance.

Thus it is apparent that there has been provided, in accordance with the invention, a semiconductor device having reduced die stress and a process for making the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a semiconductor device in accordance with the present invention may have either a die-up or die-down configuration. Likewise, the lead configuration of a semiconductor device in accordance with the invention may be any of those known in the art. In addition, the invention is not limited to using the substrate or lid materials described. The lid material should be chosen so that the CTE of the lid closely matches that of the substrate material. Other material properties may also be taken into account for choosing the lid material, such as thermal dissipation properties, radiation emission properties, or frequency attenuation properties. Also, the size of the lid is not restricted in the present invention, but the lid size should be sufficient to adequately constrain the expansion and contraction of an encapsulant material. Like the lid material, the encapsulant material may be chosen to meet specific functional requirements. The type of encapsulant material used is not limited by the present invention. Therefore, it is intended that this invention encompass all such variations and modifications as fall within the scope of the appended claims.

I claim:

1. A semiconductor die having reduced die stress comprising:
    a semiconductor die having an active surface;
    a plurality of leads electrically coupled to the active surface;
    a lid overlying the active surface of the semiconductor die and separated from the active surface by a space, the lid being of a material which has a coefficient of thermal expansion which closely approximates that of the semiconductor die; and
    an encapsulant material filling at least a portion of the space between the lid and the semiconductor die, the encapsulant material having a thickness on the order of one millimeter or less above the semiconductor die, and adhesively coupled to both the lid and the active surface of the semiconductor die such that the lid constrains thermal expansion and contraction of the encapsulant material to reduce semiconductor die stress.

2. The semiconductor device of claim 1 where the semiconductor die and the lid are both comprised of silicon.

3. The semiconductor device of claim 1 wherein the encapsulant material substantially fills the space between the lid and the semiconductor die.

4. The semiconductor device of claim 1 wherein the encapsulant material does not completely occupy the space between the lid and the semiconductor die.

5. The semiconductor device of claim 1 wherein the lid overlies a portion of the plurality of leads.

6. The semiconductor device of claim 1 wherein the plurality of leads are electrically coupled to the active surface by tape automated bonding (TAB).

7. The semiconductor device of claim 1 wherein the lid is electrically coupled to at least one lead of the plurality of leads.

8. The semiconductor device of claim 7 wherein the at least one lead of the plurality of leads comprises at least one lead which is designated as a ground lead.

9. The semiconductor device of claim 1 wherein the encapsulant material is a thermally conductive encapsulant material.

10. A semiconductor device having reduced die stress comprising:
    a semiconductor die having an active surface, the active surface having a peripheral portion and a central portion;
    a plurality of leads electrically coupled to the peripheral portion of the active surface of the semiconductor die;
    a lid overlying the plurality of leads and the active surface of the semiconductor die, the lid having a protruding portion positioned adjacent the active surface which is closer to the active surface of the semiconductor die than other portions of the lid to enhance thermal dissipation, the lid being of a material which has a coefficient of thermal expansion which closely approximates that of the semiconductor die; and
    an encapsulant material adhesively coupling the lid to the active surface of the semiconductor die such that the lid constrains thermal expansion and contraction of the encapsulant material to reduce semiconductor die stress.

11. The semiconductor device of claim 10 wherein both the lid and semiconductor die are comprised of silison.

12. The semiconductor device of claim 10 wherein the protruding portion of the lid is electrically coupled to one of the plurality of leads.

13. The semiconductor device of claim 10 wherein the encapsulant material is a thermally conductive encapsulant material.

14. A semiconductor device having reduced die stress comprising:
    a semiconductor die comprised of a bulk material and having an active surface, the active surface having a peripheral portion and a central portion;
    a plurality of leads electrically coupled to the peripheral portion of the active surface of the semiconductor die;
    a lid overlying the active surface of the semiconductor die and separated from the active surface by a space, the lid being of a material which has a coefficient of thermal expansion which closely approximates that of the semiconductor die; and
    an encapsulant material adhesively coupling the lid to the peripheral portion of the active surface of the semiconductor die without completely filling the space between the active surface and the lid.

15. The semiconductor device of claim 13 wherein the bulk material and the lid are both comprised of silicon.

16. A semiconductor device having reduced die stress comprising:
- a semiconductor die having an active surface;
- a lid overlying the active surface of the semiconductor die and separated from the active surface by a space, the lid being of a material which has a coefficient of thermal expansion which closely approximates that of the semiconductor die;
- a plurality of leads electrically coupled to the active surface, at least one of the plurality of leads being designated as a ground lead and being electrically coupled to the lid; and
- an encapsulant material filling at least a portion of the space between the lid and the semiconductor die and adhesively coupled to both the lid and the active surface of the semiconductor die such that the lid constrains thermal expansion and contraction of the encapsulant material to reduce semiconductor die stress.

* * * * *

UNITED STATES PATENT AND TRADEMARK OFFICE
CERTIFICATE OF CORRECTION

PATENT NO. : 5,173,764

DATED : December 22, 1992

INVENTOR(S) : Leo M. Higgins III

It is certified that error appears in the above-identified patent and that said Letters Patent is hereby corrected as shown below:

Column 10, line 45, claim 11, change "silison" to --silicon--.

Signed and Sealed this

Second Day of November, 1993

Attest:

BRUCE LEHMAN

*Attesting Officer*     *Commissioner of Patents and Trademarks*